United States Patent [19]

Mok et al.

[11] Patent Number: 5,057,909
[45] Date of Patent: Oct. 15, 1991

[54] ELECTRONIC DEVICE AND HEAT SINK ASSEMBLY

[75] Inventors: Lawrence S. Mok, Yorktown Heights, N.Y.; Robert E. Schwall, Ridgefield, Conn.; Ho-Ming Tong, Yorktown Heights, N.Y.

[73] Assignee: International Business Machines Corporation, Armonk, N.Y.

[21] Appl. No.: 646,489

[22] Filed: Jan. 28, 1991

Related U.S. Application Data

[63] Continuation of Ser. No. 472,501, Jan. 29, 1990, abandoned.

[51] Int. Cl.$^5$ ............ H01L 23/02; H01L 23/16; H02B 1/00; H05K 7/20
[52] U.S. Cl. .............................. 357/81; 357/75; 357/79; 357/80; 361/381; 361/386; 361/389
[58] Field of Search ............... 357/81, 82, 74, 80, 357/75, 79; 361/379, 380, 384, 388, 389

[56] References Cited

U.S. PATENT DOCUMENTS

| | | | |
|---|---|---|---|
| 3,999,105 | 12/1976 | Archey et al. | 317/100 |
| 4,323,914 | 4/1982 | Berndlmaier et al. | 357/82 |
| 4,567,505 | 1/1986 | Pease et al. | 357/81 |
| 4,651,192 | 3/1987 | Matsushita et al. | 357/81 |
| 4,663,649 | 5/1987 | Suzuki et al. | 357/81 |
| 4,823,863 | 4/1989 | Nakajima et al. | 165/80.4 |
| 4,885,662 | 12/1989 | Bartholomew et al. | 357/81 |

OTHER PUBLICATIONS

"Ultra Reliable HWSI with Aluminum Nitride Packaging", by John K. Hagge, Electronic Packaging and Production, Sep. 1979, p. 1271.
"Module With Internal Elements for Reducing Thermal Resistance", by Arnold et al, IBM Technical Disclosure Bulletin, vol. 21, No. 4, Sep. 1978, pp. 1473 and 1474.
"Thermally Enhanced Semiconductor Chip Packaging Structure", by Coughlin et al., IBM Technical Disclosure Bulletin, vol. 21, No. 1, Jun. 1978, p. 185.

*Primary Examiner*—Andrew J. James
*Assistant Examiner*—Carl Whitehead, Jr.
*Attorney, Agent, or Firm*—Daniel P. Morris; Alvin J. Riddles

[57] ABSTRACT

In integrated circuit packaging, chips are bonded to one side of an intermediate wafer that is resiliently mounted at the periphery with the entire other side of the intermediate wafer being maintained in conformal thermal transfer to external heat dissipation free of any solid connection.

8 Claims, 2 Drawing Sheets

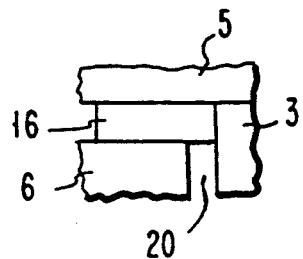
FIG. 3
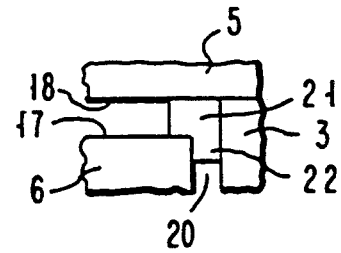
FIG. 4
FIG. 5
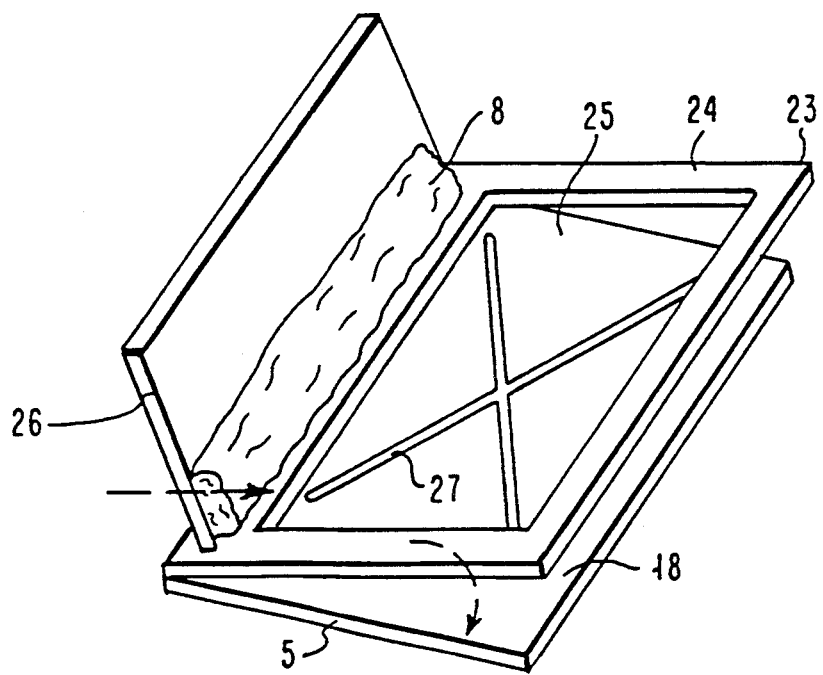

5,057,909

ELECTRONIC DEVICE AND HEAT SINK ASSEMBLY

This application is a continuation of application Ser. No. 07/472,501, filed Jan. 29, 1990, now abandoned.

TECHNICAL FIELD

The invention relates generally to the packaging of semiconductor devices and more particularly to the removal of heat formed inside the semiconductor packaging structure.

BACKGROUND OF THE INVENTION

Progress in semiconductor technology has led to increased component density both in the integrated circuit chips themselves and in the packaging of the chips in assemblies of several chips known in the art by the term modules. The modules contain a group of interwired chips mounted in a housing assembly that facilitates attachment and connection to external wiring and dissipation of heat. While at the increased density, the individual chips involve very low currents, at the present state of the art the number of devices per chip may approach hundreds of thousands and the number of chips per module may approach a quantity of the order of a hundred, so that heat transfer has now become a most serious consideration.

One type of module package heretofore in the art transfers heat produced in the chip to the housing from the back of the chip through a viscous but conformal material, such as: a liquid metal as shown in U.S. Pat. No. 4,323,914; an oil filled porous layer as shown in U.S. Pat. No. 4,823,863; a thermal grease as shown in U.S. Pat. No. 4,567,505; and a thermal grease with a conformal foil as shown in IBM Technical Disclosure Bulletins Vol. 21, No. 1, June 1978, page 185 and Vol. 21, No. 4, September 1978, page 1473.

Another type of module package heretofore in the art employs an intermediate wafer of silicon on which is disposed some distribution wiring supported by a center post to provide thermal expansion movement and to which the chip contacts are bonded. One such module relies on a special material, AlN, as part of the package, shown in "Ultra Reliable HWSI With Aluminum Nitride Packaging" by J. K. Hagge in Electronic Packaging and Production, Sept. 1979, page 1271. Another such module shown in U.S. Pat. No. 3,999,105 employs liquid encapsulation.

The use of the center post supported intermediate wafer, of the same or thermal expansion matched material such as monocrystalline silicon, as density increases and dimensions decrease, may involve unpredictability and somewhat extensive movement since all heat may not be uniformly generated. In such a situation, fractures could appear in the intermediate wafer after only a few thermal cycles.

SUMMARY OF THE INVENTION

An integrated circuit packaging principle in which chips are bonded to one side of an intermediate wafer that is resiliently mounted at the periphery with the entire other side of the intermediate wafer being maintained in conformal thermal transfer to external heat dissipation, free of any solid connection.

BRIEF DESCRIPTION OF THE DRAWINGS

FIGS. 3 and 4 are schematic sketches of different positioning of the resilient intermediate wafer mounting.

FIG. 5 is a schematic illustration of the application of a measured quantity of thermal grease in a method of the assembly of the structure of the invention.

BEST MODE DESCRIPTION OF THE INVENTION

In accordance with the invention, a module type package containing a plurality of interwired chips adapted for positioning on an external wiring bearing substrate is made up of: a thermal dissipation and supporting housing, that is attachable to an external wiring bearing substrate; an intermediate wafer chip supporting member, having the chips positioned on the side thereof that is next to the external wiring substrate and which is resiliently mounted at the periphery by a member that not only provides resiliency in intermediate wafer support but also serves as a container for a quantity of a thermal grease that completely fills the space between the other side of the intermediate wafer and the housing. The structure of the invention provides a simple construction that permits a radical improvement in heat cycles in service.

Figure 1:
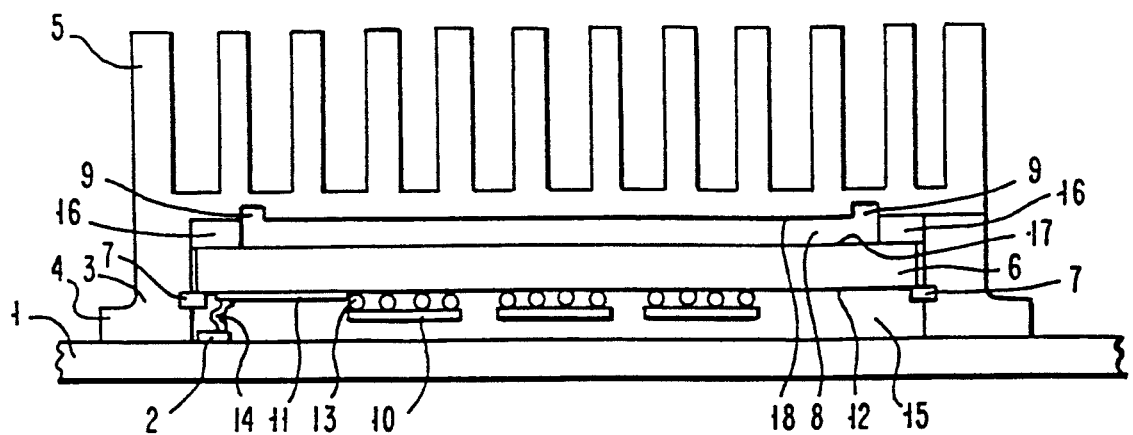
FIG. 1 is a cross sectional schematic view of the structure of the invention.

Referring to FIG. 1, on an external wiring bearing substrate 1 such as a printed circuit where the wiring is shown schematically as element 2, there is positioned a module housing 3 having a number of interdependent features. The housing 3 is equipped with: a means of attachment 4 to the external wiring substrate 1 shown as pads for soldering; means for heat dissipation 5 shown schematically as fins for transfer to a fluid medium such as air or a liquid; an intermediate wafer 6 supporting and positioning means 7 shown schematically as a removable member and may include a thermal grease 8 expansion accommodation means 9 shown schematically as a groove into and out of which the thermal grease 8 can move when heat generated in service causes the intermediate wafer 6 to change shape. The thermal grease 8 is a suspension of high thermal conductivity solid particles, such as zinc oxide or ceramic, suspended in silicone or mineral oil. The material is normally a paste.

The module package employs an intermediate wafer 6 chip mounting member. The intermediate wafer 6 is a close thermal match to the semiconductor material of the chips 10 which are mounted on wiring 11 shown schematically as a conductor. The intermediate wafer 6 is preferably made of a silicon monocrystalline wafer. Such wafers are about 0.025 inches thick. The use of the silicon monocrystalline material provides high flexibility but such material will fail rapidly in service if mounted so that stresses that occur with solid connections begin cracks in the wafer. An alternate wafer 6 construction could be from composite materials, such as copper-Invar-copper, copper-molybdenum-copper or more general composites containing these materials.

The chips 10 are mounted on the side 12 of the intermediate wafer that is next to the surface of the external wiring bearing substrate 1 on which the housing 3 is mounted. The chips 10 are mounted by bonding the electrical terminals thereon, shown schematically as elements 13 to the conductors 11. The conductors 11 are connected to the external wiring on the substrate 1 by a resilient conductive connection 14 shown schematically as flexible wire. There is a space 15 between the chips 10 and the substrate 1.

The intermediate wafer 6 rests on the element 7 on one side with the other side being spaced from element 5 at the periphery thereof by a resilient member 16. The edges of the intermediate wafer 6 are a movement accommodating fit in the housing 3. Element 16 serves to retain the intermediate wafer 6, while permitting expansion movement and also serves to confine lateral movement with respect to surface 17 of the thermal grease 8. The peripheral enclosure formed by element 16 also operates to relax viscosity requirements on the thermal grease 8. The element 16 may be made of silicone rubber adhesively attached to the surface 18. Such a structure is stable as low as −40° C. and as high as +125° C. with a desired operating temperature around +85° C.

In operation, in a very simple structure, the heat produced in operation is conducted away from the chips with accommodation for the various types of stresses and the potential temperature cycle damage that occurs. The intermediate wafer 6 expansion match with the chips controls the stresses where the terminals 13 are conductively bonded to the wiring 11. The flexibility of the intermediate wafer 6 controls the differences in local expansion where one chip 10 produces more heat than another. The formation of stresses in the intermediate wafer 6 is controlled by the flexible peripheral mounting 16 which permits uneven support while avoiding any rigid connection.

The heat is transferred through conduction through the terminals 13 to the intermediate wafer 6 and then via the thermal grease 8 over the entire area of the surface 17 to the housing 3 and heat dissipation means 5.

Figure 2:
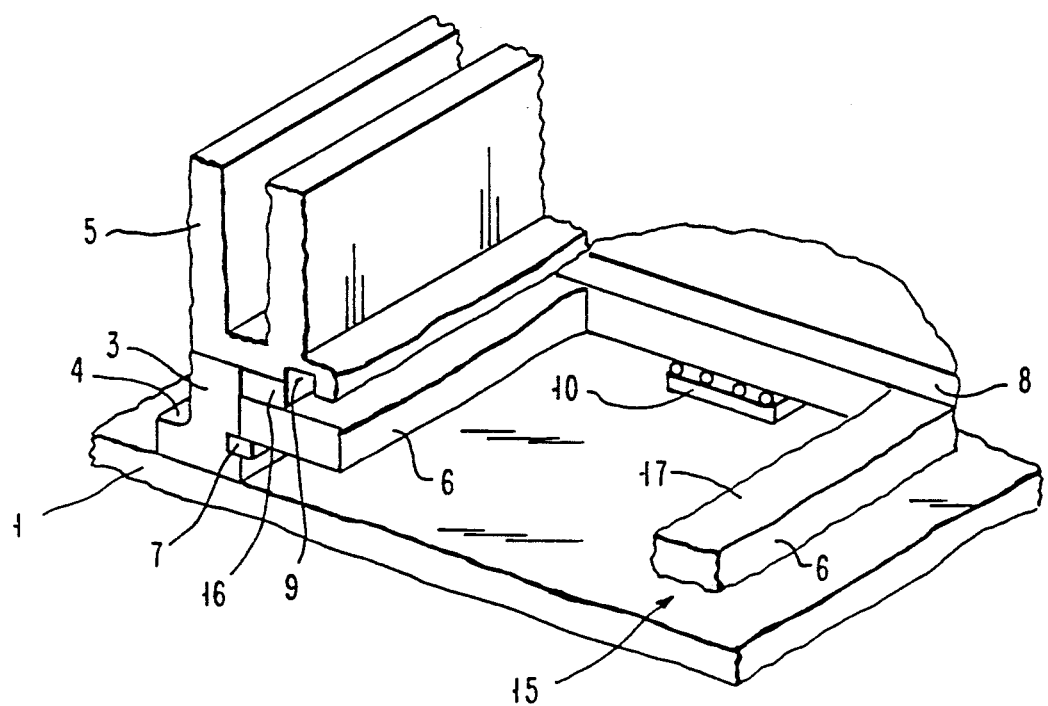
FIG. 2 is a perspective schematic view of the relative positioning of the structural elements in the invention.

Referring next to FIG. 2, the interdependent aspects of the parts and the structural simplicity of the invention are further illustrated in a perspective schematic view employing the same reference numerals. In FIG. 2, on a portion of the substrate 1, a portion of the housing 3 is attached at element 4. The intermediate wafer 6 rests on the element 7 which establishes peripheral support in one direction and the spacing 15. The intermediate wafer 6 is further spaced in the other direction by the peripheral resilient spacer member 16. On the intermediate wafer 6 there is the measured quantity of thermal grease 8 confined at the periphery by the resilient spacer member 16 and on one side by the surface 17 of the intermediate wafer 6 and on the other side by the surface 18 with expansion into and out of available space at element 9.

Referring next to FIGS. 3 and 4, which show different positionings of the resilient spacer 16. In FIG. 3, the resilient spacer 16 is positioned at the intersection of the change of direction of the housing 3 with a spacing 20 provided to permit the intermediate wafer to flex without bonding on the housing 3. In FIG. 4, a different shaped resilient spacer 21 is provided that has a portion 22 that extends into the space 20 to facilitate lateral positioning of the intermediate wafer 6.

Referring next to FIG. 5, the simplicity of the structure and ease of assembly is illustrated in a schematic illustration of the application of the measured quantity of the thermal grease 8. In FIG. 5, a perspective assembly schematic is shown in which a spacer mold 23 is shown in the process of being positioned in contact with the intermediate wafer 6. The spacer mold 23 is a simple stamping of, for example, brass shim stock with a width 24 between the measured quantity defining opening 25 and the edge of the spacer mold 23 such that the edges of the opening 25 coincide with the inside edges of the resilient spacer element 16. The member 23 has a thickness essentially equal to the thickness of the element 16. When positioned in contact with the intermediate wafer 6 as shown by the curved dotted arrow, a standard doctor blade 26 in a motion indicated by the straight dotted arrow deposits a measured quantity of thermal grease 8 on the surface 18. An alternate thermal grease expansion accommodation means 9 is shown as element 27 which is an X shaped groove in the surface 18.

The overall assembly merely involves the steps of fabricating the spacer mold 23, which defines the periphery and thickness of the measured quantity of thermal grease 8, the positioning of the spacer mold 23 in contact with the surface 18, the depositing of the measured quantity of thermal grease 8, the positioning on the surface 18 of the heat dissipator 5 of the resilient spacer 16 and the assembly of the wafer 6 and grease 8-heat dissipator 5 combination to the housing 3.

What has been described is an integrated circuit packaging principle wherein an intermediate chip bearing wafer is free to change shape during use while providing full surface area heat transfer. It will be apparent to one skilled in the art in the light of the principle that many variations in application may be employed.

Having thus described our invention, what we claim as new and desire to secure by Letters Patent is:

1. A structure comprising:
   a wafer member having essentially parallel first and second faces,
   at least one semiconductor electronic device chip mounted on said first face of said wafer member,
   a heat dissipation means having a portion thereof essentially parallel to and essentially coextensive with said second face of said wafer member,
   a spacer member disposed along the edge portions of said second face of said wafer member,
   said wafer member, said heat dissipation means and said spacer being so positioned that a closed cavity is formed between said second face of said wafer member and said essentially parallel portion of said heat dissipation means, said cavity being bounded by said spacer,
   a thermally conductive and flowable material filling said cavity, and,
   a reservoir means into which said thermally conductive and flowable material can flow on expansion.

2. The structure of claim 1 wherein said wafer member is of semiconductor material.

3. The structure of claim 1 wherein said wafer member is of a composite material.

4. The structure of claim 2 wherein said semiconductor electronic device chip is an integrated circuit of the same semiconductor material as said wafer member.

5. In an integrated circuit package the improvement comprising:
   a wafer member of a semiconductor material having essentially parallel first and second faces,
   at least one device chip of the same semiconductor material as said wafer member mounted on said first face of said wafer member,
   a heat dissipation means having a portion thereof essentially parallel to and essentially coextensive with said second face of said wafer member, a resilient spacer member disposed along the edge portions of said second face of said wafer member, said wafer member, said heat dissipation means and said resilient spacer being so positioned that a closed cavity is formed between said second face of said wafer member and said essentially parallel portion of said heat dissipation means, said cavity being bounded by said resilient spacer, a thermal grease filling said cavity, and, a reservoir means into which said thermal grease can flow on expansion.

6. The package of claim 5 wherein said semicondcutor material is silicon.

7. A structure comprising:

a wafer member having essentially parallel first and second faces with at least one semiconductor electronic device chip mounted on said first face of said wafer member, a heat dissipation means having a portion thereof essentially parallel to and essentially coextensive with said second face of said wafer member, a resilient spacer member disposed along the edge portions of said second face of said wafer member, said wafer member, said heat dissipation means and said spacer being so positioned that a closed cavity is formed between said second face of said wafer member and said essentially parallel portion of said heat dissipation means, said cavity being bounded by said spacer, a thermally conductive and flowable material filling said cavity, and, expansion accommodation means for said thermally conductive material.

8. The structure of claim 7 wherein said wafer member is of the same material as said semiconductor electronic device chip.

* * * * *